(12) United States Patent
Schubert et al.

(10) Patent No.: US 11,313,434 B2
(45) Date of Patent: Apr. 26, 2022

(54) SHOCK ABSORPTION BRACKET

(71) Applicant: Rolls-Royce North American Technologies, Inc., Indianapolis, IN (US)

(72) Inventors: Mark Schubert, Indianapolis, IN (US); Taylor Bruner, Greenwood, IN (US); Sean Guitar, Indianapolis, IN (US); Donald Robert Flagin, Indianapolis, IN (US)

(73) Assignee: ROLLS-ROYCE NORTH AMERICAN TECHNOLOGIES, INC., Indianapolis, IN (US)

( * ) Notice: Subject to any disclaimer, the term of this patent is extended or adjusted under 35 U.S.C. 154(b) by 0 days.

(21) Appl. No.: 16/916,924

(22) Filed: Jun. 30, 2020

(65) Prior Publication Data

US 2021/0404531 A1 Dec. 30, 2021

(51) Int. Cl.
*F16F 15/08* (2006.01)
*A47B 96/00* (2006.01)
*H05K 7/18* (2006.01)
*F16F 1/36* (2006.01)

(52) U.S. Cl.
CPC .............. *F16F 15/08* (2013.01); *A47B 96/00* (2013.01); *F16F 1/36* (2013.01); *H05K 7/18* (2013.01); *A47B 2220/0036* (2013.01)

(58) Field of Classification Search
CPC .. F16F 15/08; F16F 1/36; A47B 96/00; A47B 2220/0036; H05K 7/18
See application file for complete search history.

(56) References Cited

U.S. PATENT DOCUMENTS

| | | | |
|---|---|---|---|
| 1,028,797 A | 6/1912 | Stromborg | |
| 2,959,715 A | 11/1960 | Leonchick | |
| 4,632,662 A | 12/1986 | Handa | |
| 4,806,895 A * | 2/1989 | Petrow | H01F 27/027 248/500 |
| 4,850,770 A * | 7/1989 | Millar, Jr. | B60P 7/0807 410/110 |
| 4,990,096 A | 2/1991 | Bujtas et al. | |
| 5,209,356 A | 5/1993 | Chafee | |
| 5,250,752 A | 10/1993 | Cutright | |
| 5,282,114 A | 1/1994 | Stone | |
| 5,426,562 A | 6/1995 | Morehouse et al. | |

(Continued)

FOREIGN PATENT DOCUMENTS

| | | |
|---|---|---|
| CN | 103493505 A | 1/2014 |
| EP | 0833552 A2 | 4/1998 |

(Continued)

*Primary Examiner* — Ko H Chan
(74) *Attorney, Agent, or Firm* — Shumaker & Sieffert, P.A.

(57) ABSTRACT

In some examples, a shock absorption bracket includes one or more damping pads coupled to a facing surface of an absorption leg. The absorption leg is attached to a support leg and defines an internal corner with the support leg. The support leg is configured to attach to an equipment cabinet. The shock absorption bracket may be configured to define a gap between the damping pads and one or more support surfaces of the equipment cabinet. The shock absorption bracket may be configured to attach to a rear section of an equipment cabinet having an equipment access in a front section of the equipment cabinet.

20 Claims, 6 Drawing Sheets

(56) References Cited

U.S. PATENT DOCUMENTS

| | | | |
|---|---|---|---|
| 5,924,367 A * | 7/1999 | Henke | A47F 5/0087 |
| | | | 108/108 |
| 5,981,101 A * | 11/1999 | Stone | H01M 50/20 |
| | | | 429/100 |
| 6,044,990 A | 4/2000 | Palmeri | |
| 6,067,233 A * | 5/2000 | English | H05K 7/1408 |
| | | | 174/135 |
| 6,212,921 B1 * | 4/2001 | Knighton | E05B 73/0082 |
| | | | 248/551 |
| 6,238,153 B1 * | 5/2001 | Karrer | B60P 7/0815 |
| | | | 296/36 |
| 6,390,744 B1 * | 5/2002 | Parkins | B60P 7/0807 |
| | | | 410/102 |
| 6,585,212 B2 * | 7/2003 | Carnevali | B60R 11/02 |
| | | | 248/316.4 |
| 6,629,614 B2 | 10/2003 | Jordan | |
| 6,765,793 B2 | 7/2004 | Kehret et al. | |
| 7,012,805 B2 | 3/2006 | Shah et al. | |
| 7,106,582 B2 | 9/2006 | Albrecht et al. | |
| 7,471,509 B1 * | 12/2008 | Oliver | G11B 25/043 |
| | | | 312/223.2 |
| 7,740,142 B2 * | 6/2010 | Miller | H04Q 1/035 |
| | | | 211/26 |
| 8,153,700 B2 * | 4/2012 | Stearns | E04D 13/147 |
| | | | 521/58 |
| 8,240,490 B2 * | 8/2012 | Malekmadani | A47B 96/024 |
| | | | 211/188 |
| 8,547,658 B1 | 10/2013 | Szeremeta | |
| 8,575,794 B2 | 11/2013 | Lee et al. | |
| 8,721,010 B2 * | 5/2014 | Conrardy | H05K 7/183 |
| | | | 312/223.1 |
| 8,755,192 B1 | 6/2014 | Schrempp et al. | |
| 8,967,392 B1 | 3/2015 | Czamara et al. | |
| 9,301,408 B2 * | 3/2016 | Conrardy | H05K 7/183 |
| 9,326,413 B2 | 4/2016 | Franklin | |
| 9,572,278 B2 | 2/2017 | Eberle, Jr. et al. | |
| 9,784,002 B2 * | 10/2017 | Cymbala | E04G 17/02 |
| 10,082,189 B2 | 9/2018 | Kronkright et al. | |
| 2005/0084748 A1 * | 4/2005 | Miller | H01M 10/42 |
| | | | 429/99 |
| 2007/0278170 A1 | 12/2007 | Wiebe | |
| 2011/0149508 A1 | 6/2011 | Malekmadani | |
| 2012/0133570 A1 | 5/2012 | Yang et al. | |
| 2013/0160464 A1 | 6/2013 | Maszck et al. | |
| 2014/0250594 A1 | 9/2014 | Rawls-Meehan | |
| 2017/0267133 A1 | 9/2017 | Shimizu | |

FOREIGN PATENT DOCUMENTS

| | | |
|---|---|---|
| EP | 0843314 A1 | 5/1998 |
| EP | 2681924 A1 | 8/2014 |
| GB | 2423645 A | 8/2006 |
| JP | 2008240954 A | 10/2008 |
| KR | 20130045877 A | 5/2013 |
| WO | 2005123484 A1 | 12/2005 |

* cited by examiner

SHOCK ABSORPTION BRACKET

TECHNICAL FIELD

The disclosure relates to a shock absorption bracket configured to absorb and/or dampen shock and/or vibration energy.

BACKGROUND

Equipment cabinets are used for storage of rack equipment, such as rack-mounted electronics. The rack-mounted electronics may rest on one or more rails and a faceplate of the rack-mounted electronics may be attached to the rack using a fastener. This may be sufficient for racks and equipment cabinets that are substantially stationary during use, but may allow some relative movement between the rack or equipment cabinet and the rack-mounted electronics in instances in which the rack or storage cabinet is used in a moving environment, such as a vehicle, aircraft, ship, space system, or the like.

SUMMARY

In general, the disclosure describes a shock absorption bracket configured to absorb and/or dampen shock impulses and/or vibrations transmitted to one or more damping pads. The shock absorption bracket includes an absorption leg defining a facing surface, with the damping pads coupled to the facing surface. A support leg is attached to the absorption leg. The shock absorption bracket may be configured for attachment to an equipment cabinet. The damping pads may be configured to absorb and/or dampen shock impulses and/or vibrations transmitted from racked equipment within or around the equipment cabinet to the shock absorption bracket. This may reduce relative movement between the racked equipment and the equipment cabinet, which may reduce stresses on the racked equipment, the equipment cabinet, and/or fasteners used to attach the racked equipment to the equipment cabinet.

In one example, a shock absorption bracket includes an absorption leg having a leading edge, an inner side, and an outer side opposite the inner side, wherein the leading edge separate the inner side and the outer side. One of the inner side or the outer side defines a facing surface. The shock absorption bracket includes a support leg attached to the absorption leg. The inner side of the absorption leg and the support leg define an internal corner, such that some portion of the inner side separates the leading edge and the internal corner. The shock absorption bracket includes a damping pad coupled to the facing surface.

In one example, a system includes a structure defining a support surface and a shock absorption bracket. The shock absorption bracket includes an absorption leg having a leading edge, an inner side, and an outer side opposite the inner side. The leading edge separates the inner side and the outer side. One of the inner side or the outer side defines a facing surface. The shock absorption bracket includes a support leg attached to the absorption leg and attached to the structure. The inner side of the absorption leg and the support leg define an internal corner, such that some portion of the inner side separates the leading edge and the internal corner. The shock absorption bracket includes a damping pad having an absorption surface and a coupling surface opposite the absorption surface, with the coupling surface is coupled to the facing surface of the absorption leg and the absorption surface substantially facing the support surface.

A technique includes positioning an absorption surface of a damping pad of a shock absorption bracket toward a support surface of structure to define a gap between the absorption surface and the support surface, wherein a coupling surface of the damping pad is coupled to a facing surface of an absorption leg of the shock absorption bracket. The technique further includes attaching a support leg of the shock absorption bracket to the structure, wherein the support leg and the absorption leg define an internal corner.

The details of one or more examples are set forth in the accompanying drawings and the description below. Other features, objects, and advantages will be apparent from the description and drawings, and from the claims.

DETAILED DESCRIPTION

The disclosure describes a shock absorption bracket configured to at least partially absorb shock impulses and/or vibrations delivered to damping pads attached to the shock absorption bracket. The shock absorption bracket is configured such that the damping pads face one or more support surfaces intended to support rack equipment (e.g., electronics and/or electrical equipment). The shock absorption bracket may be attached to the structure (e.g., the equipment cabinet) such that the damping pads substantially face a housing of one or more pieces of rack equipment supported by the support surfaces when the rack equipment is installed in the equipment cabinet. The damping pads are configured to absorb kinetic energy (e.g., from a shock event) and/or damp vibration of the housing of the rack equipment when the damping pads contact the housing. Additionally, the shock absorption bracket is configured to reduce relative movement between the rack equipment and the equipment cabinet.

The shock absorption bracket may be attached to an equipment cabinet defining one or more support surfaces configured to support rack equipment in the equipment cabinet. The equipment cabinet may be configured for a substantially vertical rack unit format, and the plurality of support surfaces may extend substantially horizontally from a front section of the equipment cabinet to a rear section of the equipment cabinet. The support surfaces may be configured to support rack equipment vertically (e.g., against the force of a gravity vector acting on the rack equipment). In examples, the equipment cabinet is configured to provide the one or more support surfaces as substantially horizontal surfaces facing upward (e.g., in a direction opposite the gravity vector). The equipment cabinet may be configured to receive rack equipment for placement by translating the rack equipment over the support surfaces. For example, the equipment cabinet may be configured to receive rack equipment through an equipment access defined within the front section of the equipment rack, with the support surfaces configured to allow positioning of the rack equipment by translating the rack equipment over the support surfaces in a direction from the equipment access and toward the rear section of the equipment cabinet.

For example, the equipment cabinet may define the support surfaces using a plurality of rails (e.g., L-bracket rails) extending horizontally from a front section of the equipment cabinet to a rear section of the equipment cabinet. Alternatively, the equipment cabinet may define a support surface using a shelf extending horizontally across a width of the equipment cabinet. The shock absorption bracket is configured to attach to the equipment cabinet such that the damping pads substantially face the one or more support surfaces. The shock absorption bracket is configured to define a gap between the damping pads and the support surfaces, such that rack equipment can be inserted into the gap.

The shock absorption bracket may be configured to extend substantially horizontally over some portion of the width of the equipment cabinet. For example, the shock absorption bracket may be configured to extend between a first vertical post and a second vertical post of the equipment cabinet. The shock absorption bracket may substantially define an elongated L-bracket having an absorption leg and one or more support legs joined to the absorption leg. The absorption leg includes an inner side and an outer side opposite the inner side, with a leading edge separating the inner side and the outer side. One of the inner side or the outer side defines a facing surface. At least one support leg is attached to the absorption leg and defines an internal corner with the inner side of the absorption leg, such that some portion of the inner side separates internal corner and the leading edge. For example, the support leg may define the internal corner to have an internal angle of about 90 degrees, or some other internal angle less than 180 degrees. The internal corner may be a substantially sharp corner or may be a rounded corner (e.g., defining a curvature). In examples, the one or more support legs are a single support leg joined to the absorption leg substantially from a first end of the absorption leg to a second end of the absorption leg. In some examples, the one or more support legs include a first support leg and a second support leg joined to the absorption leg, with the first support leg and the second support leg defining a gap therebetween.

The shock absorption bracket includes one or more damping pads coupled to the facing surface of the absorption leg. The damping pads may be configured to absorb mechanical shock and/or mechanical vibration transmitted from an object (e.g., an equipment housing) to the damping pads. In some examples, the damping pads include a material (e.g., an elastomeric material) configured to absorb kinetic energy (e.g., from a shock event) and/or damp vibrations transmitted from an object (e.g., an electronics housing) to the shock absorption bracket. The damping pads include an absorption surface and mounting surface opposite the absorption surface, with the mounting surface coupled to the facing surface of the absorption leg.

In some examples, the shock absorption bracket may be used in a system that includes a structure such as an equipment cabinet configured to support rack equipment on one or more support surfaces. The shock absorption bracket may be configured to attach to the structure. For example, the structure may be an equipment cabinet configured to store rack equipment vertically, and the shock absorption bracket may be configured to extend horizontally across a width of the equipment cabinet. In some examples, the shock absorption bracket is configured for attachment to the rear section of the structure (e.g., the rear section of an equipment cabinet). The shock absorption bracket may be configured such that the leading edge of the shock absorption bracket is between the internal corner and the front section of the structure when the shock absorption bracket is attached to the rear section of the structure. In some examples, the absorption leg may flare upwards at the leading edge or be otherwise shaped to accommodate insertion of the rack equipment into a gap between the damping pads and support surfaces of the structure when, for example, the rack equipment is slid over the support surfaces from the front section of the structure towards the rear section of the structure.

The shock absorption bracket is configured to define a gap between the damping pads and the support surfaces of the structure. In some examples, the shock absorption bracket is positioned on the structure (e.g., an equipment cabinet) to define a clearance between the absorption surfaces of the damping pads and a housing of rack equipment inserted within the gap. The shock absorption bracket may be configured such that physical contact between the damping pads and the housing of the rack equipment is substantially limited to those situations where the rack equipment is temporarily displaced due to, for example, a mechanical shock imparted to the equipment cabinet and/or the support surface. The damping pads may be configured to absorb some portion of the kinetic energy of the rack equipment during the displacing event, in order to mitigate and/or avoid any damage to the rack equipment itself. In other examples, the shock absorption bracket is configured such that the damping pads are in substantially constant contact with the housing of the rack equipment inserted within the gap. Substantially constant contact may dampen vibration and limit relative motion, allowing isolators on the structure (e.g., isolators 128, 130, and/or 132 (FIG. 1)) to absorb shock impulse.

Figure 1:
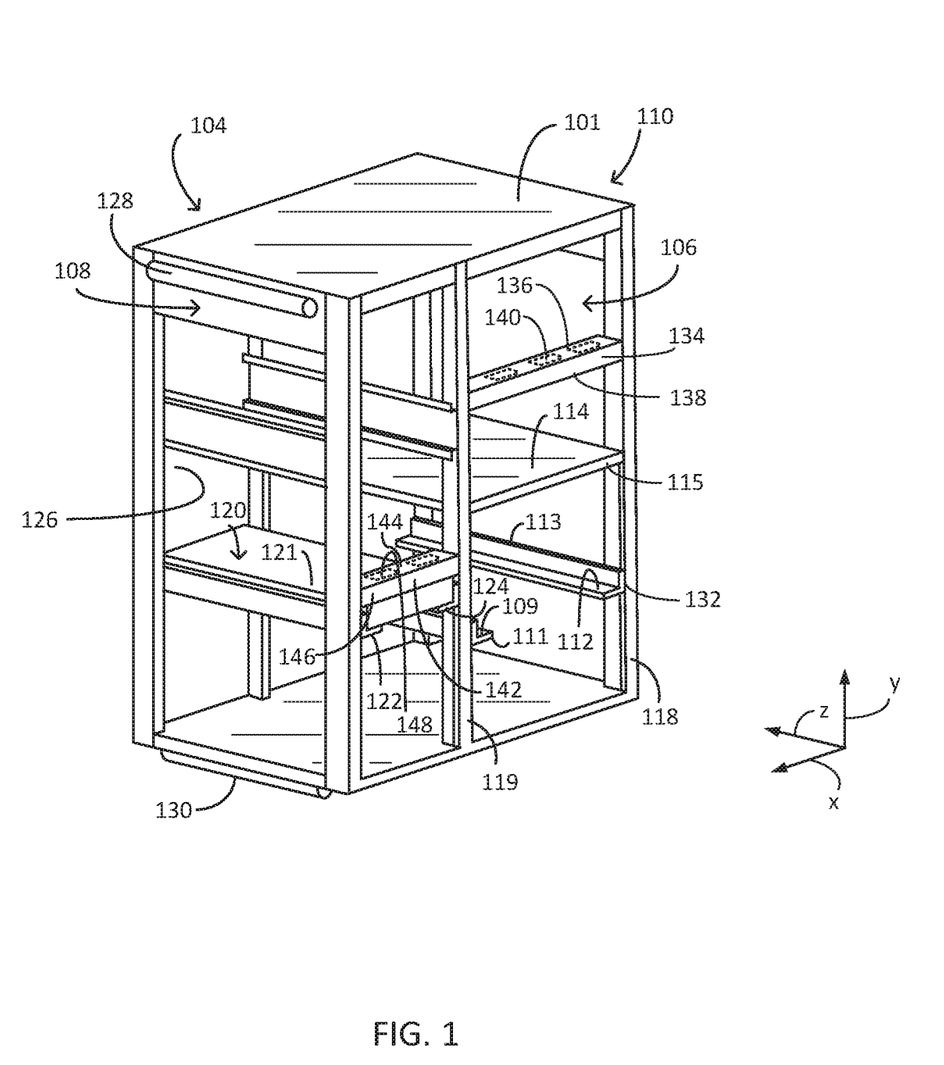
FIG. 1 is a conceptual diagram illustrating an example equipment cabinet that includes a shock absorption bracket.

FIG. 1 illustrates a system 100 including an equipment cabinet 101 configured to support and/or secure one or more items of rack equipment such as rack equipment 120. Equipment cabinet 101 is illustrated relative to a set of x-y-z axes for reference, however equipment cabinet 101 may have any orientation. Equipment cabinet 101 may be configured to hold the one or more pieces of rack equipment (e.g., rack equipment 120) substantially in a rack unit format, such that equipment cabinet 101 generally supports the racked equipment in a vertically stacked arrangement (e.g., stacked substantially parallel to the y-axis shown). Equipment cabinet 101 may be configured as a stand-alone equipment cabinet, or may be configured for location in an equipment bay which includes a plurality of equipment cabinets. For example, equipment cabinet 101 may be one of several equipment cabinets in the equipment bay of a mobile platform, such as an aircraft, ship, space vehicle, or land vehicle. In other examples, equipment cabinet 101 may be located in a substantially stationary equipment bay, such as an equipment bay of a call center, server installation, or some other facility surrounded by a geographically stationary structure.

Equipment cabinet 101 includes a front section 104, rear section 106, right side section 108, and left side section 110. Equipment cabinet 101 defines one or more support surfaces configured to support rack equipment within equipment cabinet 101, such as support surface 112 and support surface 114. In examples, support surfaces 112, 114 extend substantially from front section 104 of equipment cabinet 101 to rear section 106 of equipment cabinet 101. Support surfaces 112, 114 are configured to limit (e.g., constrain) rack equipment from movement at least in a first direction (e.g., a vertical direction), such as a negative direction of the y-axis shown. For example, support surfaces 112, 114 may be configured to support rack equipment against a gravity force substantially parallel to the y-axis shown. In an example, support surfaces 112, 114 may be substantially horizontal surfaces. For example, when support surfaces 112, 114 are configured to support rack equipment against motion in a negative direction of the y-axis (e.g., caused by a gravity vector), support surfaces 112, 114 may be horizontal surface substantially parallel to the x-z plane. Support surface 112, 114 may be substantially planar surfaces.

Equipment cabinet may define support surfaces 112, 114 in any manner. In the example depicted at FIG. 1, equipment cabinet 101 includes a rail 113 extending horizontally from front section 104 to rear section 106 and defining support surface 112. Equipment cabinet 101 may further include a rail 111 including a support surface 109 arranged substantially opposite rail 113. Equipment cabinet 101 further includes a shelf 115 defining support surface 114. Support surfaces 109, 112, 114 and other support surfaces defined by equipment cabinet 101 are configured to support rack equipment within equipment cabinet 101. For example, FIG. 1 depicts rack equipment 120 supported by support surfaces defined by rail 122 and rail 124, which may be configured similarly to rail 113. Rack equipment 120 includes a housing 121 in contact with the support surfaces of rails 122, 124. Alternately, rack equipment 120 could be supported by any of support surfaces 109, 112, 114, or some other support surface of equipment cabinet 101.

Equipment cabinet 101 may be configured to support rail 113 such that support surface 112 is a substantially horizontal surface (e.g., substantially parallel to the x-z axes and substantially perpendicular to y-axis shown). Equipment cabinet 101 may support rails 111, 122, 124 and shelf 115 similarly. For examples, equipment cabinet 101 may include a first post 118 and a second post 119, with rail 113 and/or shelf 115 attached to first post 118 and/or second post 119. First post 118 and second post 119 may be elongated members extending substantially parallel to the y-axis shown.

In examples, equipment cabinet 101 defines an equipment access 126 in front section 104 and is configured to receive rack equipment 120 through equipment access 126. For example, equipment cabinet 101 may be configured to allow positioning of rack equipment 120 within equipment cabinet 101 by passing rack equipment 120 through equipment access 126 in a direction from front section 104 towards rear section 106 (e.g., in a negative direction of the z-axis shown). In some examples, equipment cabinet 101 may be configured such that equipment access 126 is substantially the sole access point for rack equipment 120. For example, equipment cabinet 101 may be configured for placement in an equipment bay where rear section 106, right side section 108, and left side section 110 will be substantially inaccessible due to, for example, the presence of other equipment cabinets in the equipment bay, location next to a bulkhead or other structure, or some other reason. In some examples, equipment cabinet 101 is configured to mechanically couple to rack equipment 120 when rack equipment 120 is positioned within equipment cabinet 101. For example, front section 104 may be configured to couple with a front panel of rack equipment 120 (e.g., using a fastener) when rack equipment 120 is positioned within equipment cabinet 101.

Equipment cabinet 101 may be configured to absorb and/or dampen mechanical energy imparted to equipment cabinet 101 in order to mitigate the impact of the transmitted mechanical energy on rack equipment 120. For example, equipment cabinet 101 may include an isolator 128 on right side section 108 configured to absorb and/or dampen mechanical energy imparted to equipment cabinet 101 from, for example, an adjacent equipment cabinet within the same equipment bay. Equipment cabinet 101 may include additional isolators configured similarly, including one or more isolators on left side section 110, and isolator 130 configured to contact a floor or deck vertically supporting equipment cabinet 101. Isolators 128, 130 may have any configuration (e.g., form, shape, etc.) sufficient to absorb and/or dampen a mechanical energy passing through isolators 128, 130. For example, isolators 128, 130 may include one or more rings, helical coils, isolation pads, or other configurations for the absorption and/or dampening of transmitted mechanical energy.

The transmitted mechanical energy may be a relatively discrete impulse force (e.g., due to a mechanical shock) and/or may be a relatively steady-state mechanical vibration (e.g., due to rotating machinery or another source of mechanical vibration in the vicinity of equipment cabinet 101). Isolators 128, 130 may be configured to receive the mechanical energy transmitted to equipment cabinet 101 and absorb and/or dampen the mechanical energy as it passes through isolators 128, 130 to the remainder of equipment cabinet 101, such that a reduced amount of the mechanical energy is transmitted through equipment cabinet 101 to rack equipment 120. In examples, isolators 128, 130 are configured to absorb and/or dampen mechanical energy (e.g., mechanical vibrations) originating from within equipment cabinet 101 (e.g., by rack equipment 120), in order to reduce the transmission of the mechanical energy from equipment cabinet 101 to an adjacent structure, such as another equipment cabinet or a floor or deck supporting equipment cabinet 101.

Equipment cabinet 101 may include one or more isolators configured to absorb and/or dampen mechanical energy exchanged between one or more of support surfaces 109, 112, 114 and another portion of equipment cabinet 101. For example, equipment cabinet 101 may include an isolator 132 between rail 113 and first post 118. Isolator 132 may be configured to absorb and/or dampen mechanical energy passing from another portion of equipment cabinet 101 to rail 113, such as mechanical energy imparted to equipment cabinet via isolator 128 or isolator 130. Isolator 132 may be configured to absorb and/or dampen mechanical energy passing from rail 113 to another portion of equipment cabinet 101, such as mechanical vibrations emanating from rack equipment supported by rail 113. Isolator 132 may have any configuration (e.g., form, shape, etc.) sufficient to absorb and/or dampen mechanical energy passing through isolator 132. For example, isolator 132 may include one or more rings, helical coils, isolation pads, or other configurations for the absorption and/or dampening of transmitted mechanical energy.

Equipment cabinet 101 further includes shock absorption bracket 134 ("bracket 134"). Bracket 134 is configured to receive mechanical energy from rack equipment positioned within equipment cabinet 101 and absorb some portion of the mechanical energy. Bracket 134 includes an absorption leg 136 coupled to one or more support legs 138 ("support leg 138"), with one or more damping pads 140 ("damping pad 140") coupled to absorption leg 136. Damping pad 140 is coupled to a non-visible facing surface of absorption leg 136 and is shown in hidden lines. Bracket 134 is configured to attach to equipment cabinet 101. In FIG. 1, bracket 134 is configured such that an absorption surface of damping pad 140 substantially faces support surface 114 when bracket 134 is attached to equipment cabinet 101. Bracket 134 may be attached to equipment cabinet 101 such that an absorption surface of damping pad 140 substantially faces support surface 112, or another support surface of equipment cabinet 101.

In examples, bracket 134 is configured such that damping pad 140 is substantially between absorption leg 136 and support surface 114, support surface 112, and/or another support surface when bracket 134 is attached to equipment cabinet 101. Bracket 134 may be configured such that absorption leg 136 extends substantially over a width of support surface 114, support surface 112, and/or another support surface (e.g., a width substantially parallel to the x-axis). In examples, equipment cabinet 101 is configured such that bracket 134 and support surface 114, support surface 112, and/or another support surface define a displacement (e.g., parallel to the y-axis) between bracket 134 and support surface 114, support surface 112, and/or another support surface. A facing surface of absorption leg 136 (e.g., the surface in contact with damping pads 140) may be substantially parallel to support surface 114, support surface 112, and/or another support surface. In examples, the facing surface of absorption leg 136 may be at an angle (e.g., substantially non-parallel) to support surface 114, support surface 112, and/or another support surface. In examples, bracket 134 is attached to rear section 106 of equipment cabinet 101. For example, bracket 134 may extend from first post 118 to second post 119 in rear section 106.

Equipment cabinet 101 further includes shock absorption bracket 142 ("bracket 142"). Bracket 142 includes absorption leg 144, support leg 146, and damping pad 148, which may be configured on bracket 142 and relative to each other in the same manner as like-named components of bracket 134. In examples, equipment cabinet 101 is configured such that bracket 142 and support surface 114 define a displacement (e.g., parallel to the y-axis) between bracket 142 and the support surfaces (not shown) of rail 122 and/or rail 124. A facing surface of absorption leg 144 (e.g., the surface in contact with damping pads 148) may be substantially parallel to the support surfaces of rail 122 and/or rail 124. In examples, the facing surface of absorption leg 144 may be at an angle (e.g., substantially non-parallel) to the support surfaces of rail 122 and/or rail 124.

Bracket 142 is attached to equipment cabinet 101 and positioned such some portion of rack equipment 120 is between damping pads 148 and the support surfaces of rail 122 and/or rail 124. An absorption surface of damping pad 148 substantially faces housing 121 of rack equipment 120. Bracket 142 is configured to receive and absorb some portion of a mechanical energy from rack equipment 120 when rack equipment 120 is positioned within equipment cabinet 101 and rack equipment 120 contacts damping pads 148 (either as an impact or substantially continuous contact).

Figure 2:
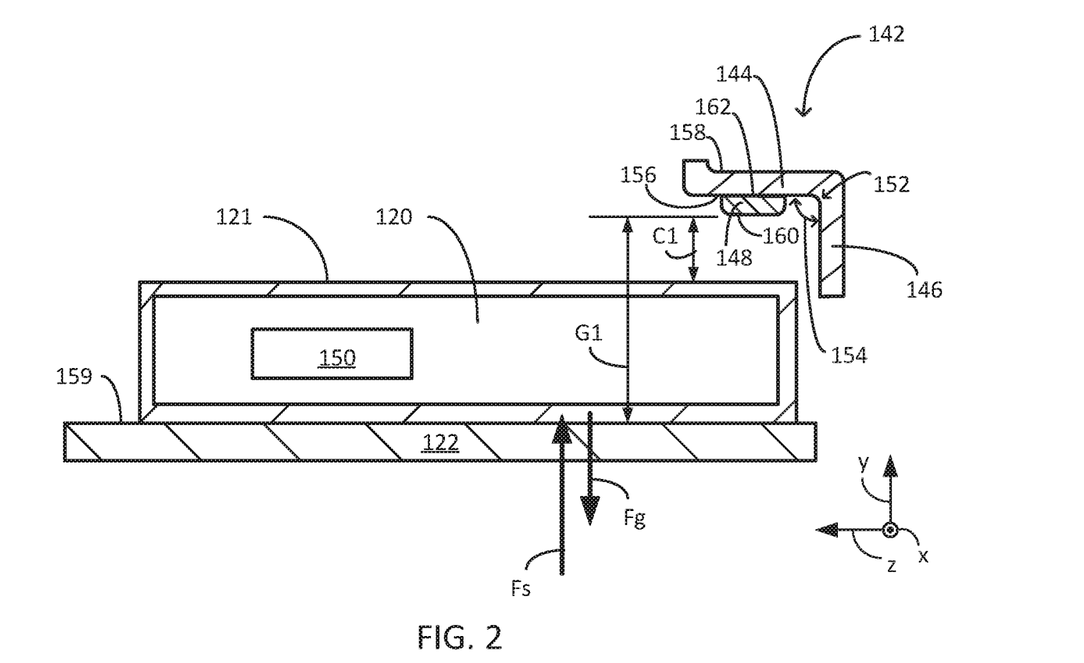
FIG. 2 is a schematic illustration of a shock absorption bracket and a support surface supporting rack equipment.

For example, FIG. 2 illustrates a cross-section of bracket 142 including absorption leg 144, support leg 146, and damping pads 148, rail 122, and rack equipment 120 including housing 121. FIG. 2 provides a cross-section taken with a cutting plane taken parallel to the y-z axis of the x-y-z axes shown in FIGS. 1 and 2. Housing 121 surrounds and/or encloses electronic and/or electrical components 150 ("components 150") of rack equipment 120. Absorption leg 144 and support leg 146 are joined and form an internal corner 152 defining an interior angle 154. Absorption leg 144 includes an inner side 156 within interior angle 154 and an outer side 158 opposite inner side 156. Rail 122 includes support surface 159, which is configured relative to rail 122 in the same manner as support surface 112 relative to rail 113 (FIG. 1). In the example of FIG. 2, housing 121 of rack equipment 120 is in contact with support surface 159 such that rail 122 supports rack equipment 120 against motion in a negative direction of the y-axis (e.g., motion due to a gravity vector).

Damping pads 148 include an absorption surface 160 and coupling surface 162 on a side of damping pads 148 opposite absorption surface 160. Coupling surface 162 is attached to inner side 156 of absorption leg 144. Bracket 142 is configured such that absorption surface 160 substantially faces support surface 159 of rail 122. In an example, bracket 142 and support surface 159 define a gap G1 between bracket 142 and support surface 159. In examples, bracket 142 is configured to define a clearance Cl between bracket 142 and housing 121 of rack equipment 120. In some examples (e.g., FIG. 3), bracket 142 is configured such that absorption surface 160 is substantially in contact with housing 121 when rack equipment 120 is supported by rail 122.

Bracket 142 is configured to limit a displacement of rack equipment 120 in a direction substantially parallel to the y-axis. In examples, equipment cabinet 101 is configured such that bracket 142 limits a displacement of rack equipment 120 in a first direction (e.g., a positive direction of the y-axis) while rail 122 limits a displacement of rack equipment 120 in a second direction opposite the first direction (e.g., a negative direction of the y-axis). For example, rail 122 may be configured to resist motion of rack equipment 120 due to a gravity vector causing a gravity force Fg on rack equipment 120. In the absence of any other significant forces acting on rack equipment 120, rack equipment 120 is substantially constrained against motion parallel to the y-axis and establishes a resting posture on support surface 159. Rail 122 is configured such that rack equipment 120 substantially remains at rest on support surface 159 (e.g., does not experience substantial motion parallel to the y-axis) unless a force opposite to and exceeding the gravity force Fg acts on rack equipment 120.

Bracket 142 is configured to limit a displacement of rack equipment 120 in a direction opposite that of the motion limited by rail 122. For example, if rail 122 imparts a force Fs to rack equipment 120 which exceeds the force Fg, bracket 142 is configured to limit the displacement of rack equipment 120 which might occur. The force Fs might arise due to, for example, a structure and/or an environment surrounding equipment cabinet 101 transmitting a force to equipment cabinet 101, and equipment cabinet 101 transmitting some portion of that force to rail 122 as the force Fs. The force transmitted to equipment cabinet 101 might be, for example, a force from an explosive imparted to equipment cabinet 101, a relatively sudden change in the motion of a mobile platform carrying equipment cabinet 101, or some other cause. Bracket 142 is configured on equipment cabinet 101 (FIG. 1) such that, if the force Fs is sufficient to displace rack equipment 120 over the clearance Cl, absorption surface 160 contacts housing 121 and substantially ceases further displacement. Additionally, bracket 142 is configured to absorb and/or dampen a mechanical energy imparted from rack equipment 120 to damping pads 148 when rack equipment 120 contacts (e.g., impacts) absorption surface 160. Absorption and/or dampening of the mechanical energy by damping pads 148 may reduce the force felt by components 150 during the displacement event.

Figure 3:
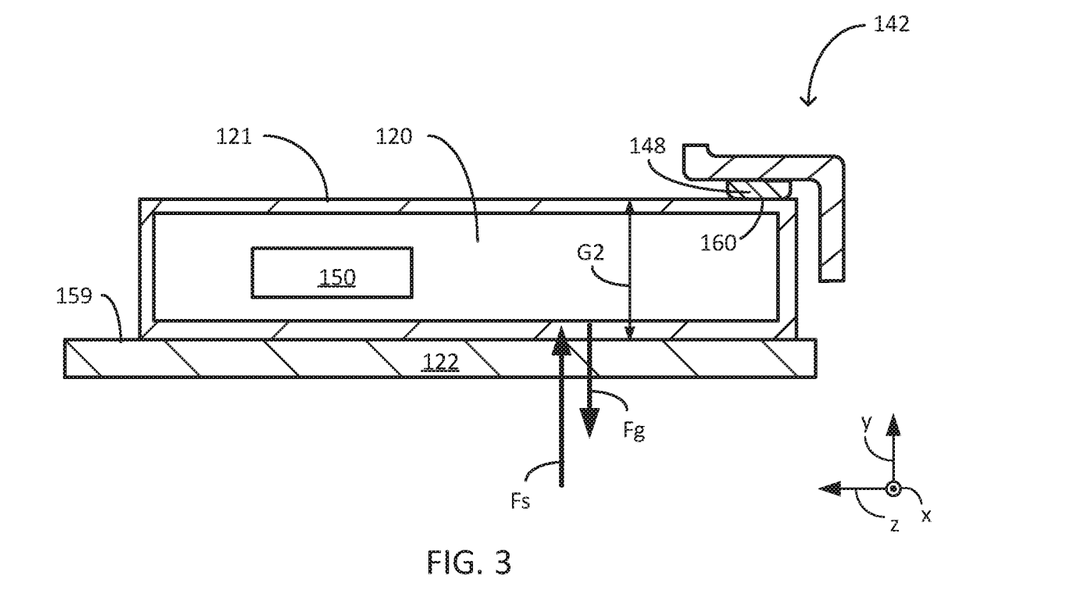
FIG. 3 is a schematic illustration of another shock absorption bracket.

In some examples, bracket 142 is configured to substantially maintain contact with rack equipment 120 as rail 122 supports rack equipment 120 on support surface 159. For example, FIG. 3 illustrates bracket 142 positioned on equipment cabinet 101 (FIG. 1) such that absorption surface 160 of damping pads 148 are substantially in contact with housing 121 as support surface 159 supports rack equipment 120 (e.g., bracket 142 defines a gap G2 between bracket 142 and support surface 159, and clearance Cl (FIG. 2) is substantially zero). With bracket 142 in substantially constant contact with rack equipment 120, bracket 142 is configured to absorb and/or dampen a mechanical energy imparted from rack equipment 120 to damping pads 148 when the force Fs exceeds the force Fg. In addition, with bracket 142 in substantially constant contact with rack equipment 120, bracket 142 is configured to absorb and/or dampen mechanical energy exchanged between rack equipment 120 and bracket 142. For example, bracket 142 may be configured to absorb and/or dampen mechanical energy passing from another portion of equipment cabinet 101 to rack equipment 120, such as mechanical energy imparted to equipment cabinet via isolator 128 or isolator 130 (FIG. 1). Bracket 142 may be configured to absorb and/or dampen mechanical energy passing from rack equipment 120 to another portion of equipment cabinet 101, such as mechanical vibrations or other mechanical energy emanating from rack equipment 120. Additionally, relative motion between equipment cabinet 101 and rack equipment 120 may be substantially absent (e.g., equipment cabinet 101 and rack equipment 120 may be substantially stationary relative to each other) when bracket 142 substantially maintains contact with rack equipment 120, and impulse load events may be dampened by isolators 128, 130, and/or 132.

Figure 4A:
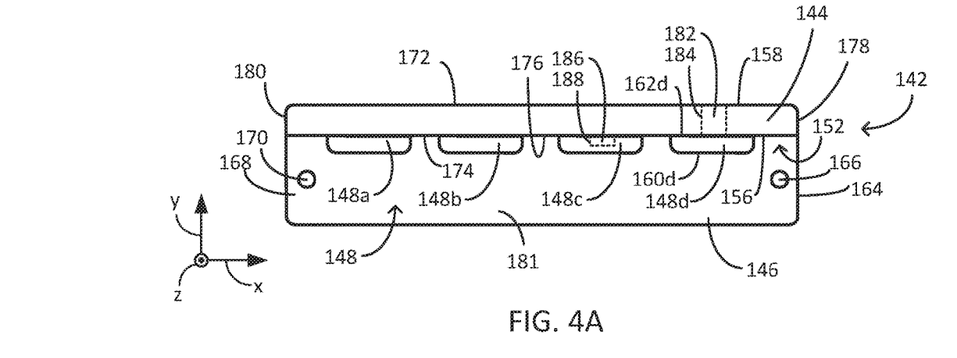
FIG. 4A is a front view of an example shock absorption bracket.
Figure 4B:
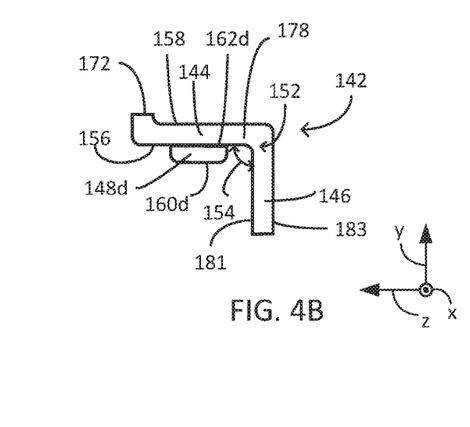
FIG. 4B is a side view of the shock absorption bracket of FIG. 4A.
Figure 4C:
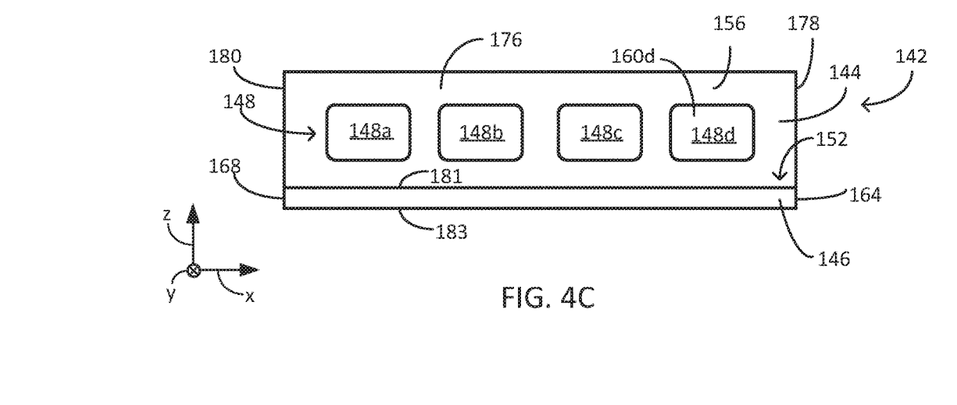
FIG. 4C is a bottom view of the shock absorption bracket of FIG. 4A and FIG. 4B.
Figure 4D:
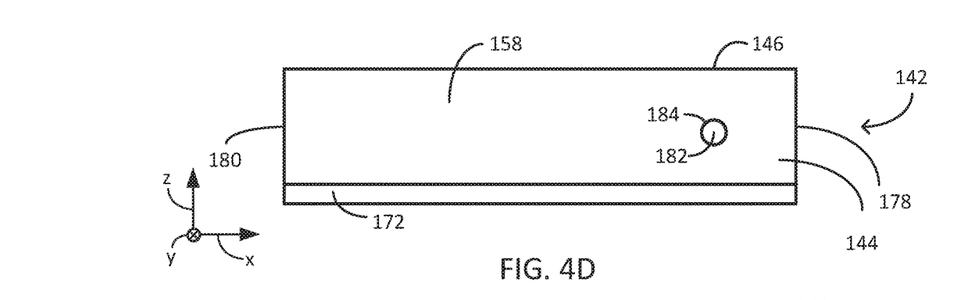
FIG. 4D is a top view of the shock absorption bracket of FIG. 4A, FIG. 4B, and FIG. 4C.

Bracket 142 is further illustrated in FIGS. 4A-4D. FIG. 4A illustrates a front view of an example bracket 142. FIG. 4B illustrates a side view of the example bracket 142. FIG. 4C illustrates a bottom view of the example bracket 142. FIG. 4D illustrates a top view of the example bracket 142. FIGS. 4A-4D are illustrated with reference to the x-y-z axes of each figure, where the circle-dot illustrates an axis pointing out of the page and the circle-cross illustrates an axis pointing into the page.

Bracket 142 may substantially be an elongated L-bracket, with absorption leg 144 and support leg 146 defining internal corner 152 and support leg 146 joined to absorption leg 144. Bracket 142 includes damping pads 148 including damping pad 148a, damping pad 148b, damping pad 148c, and damping pad 148d. Each of damping pad 148a, damping pad 148b, damping pad 148c, and damping pad 148d include an absorption surface and a coupling surface, such as absorption surface 160d and coupling surface 162d of damping pad 148d. Absorption leg 144 includes inner side 156 and outer side 158, with damping pad 148a, 148b, 148c, 148d coupled to inner side 156. Support leg 146 includes a first end 164 ("support first end 164") configured for attachment to equipment cabinet 101 (FIG. 1). In examples, support first end 164 includes a first slot 166 passing through support first end 164 and configured to receive a fastener. Support leg 146 may include a second end 168 ("support second end 168") instead of or in addition to support first end 164, and may include a second slot 170 passing through support second end 168 instead of or in addition to first slot 166.

Absorption leg 144 includes a leading edge 172 separating inner side 156 and outer side 158 of absorption leg 144. Support leg 146 is attached to absorption leg 144 such that inner side 156 and support leg 146 define internal corner 174. Some portion of inner side 156 is between internal corner 174 and leading edge 172. In the example of FIGS. 4A-4D, inner side 156 defines facing surface 176. Bracket 142 is configured such that facing surface 176 substantially faces one or more support surfaces (e.g., support surface 109, 112, 114, 159) of equipment cabinet 101 (FIG. 1) when bracket 142 is attached to equipment cabinet 101. As will be discussed, facing surface 176 may be defined by outer side 158 in other examples.

Internal corner 152 defines interior angle 154. Interior angle 154 may be an angle described substantially in the y-z plane of FIGS. 4A-4D. Absorption leg 144 and support leg 146 may form internal corner 152 to define any interior angle 154. In examples, interior angle 154 is less than 180 degrees. In some examples, interior angle 154 is about 90 degrees. In certain examples, some portion of bracket 142 (e.g., a portion including or adjacent to internal corner 152) is made from a ductile material, and bracket 142 is configured to flex and cause an increase in the interior angle 154 when, for example, a force in the positive direction of the y-axis acts on an absorption surface of damping pads 148. Bracket 142 may be configured to flex elastically and/or plastically. For example, when bracket 142 is positioned on equipment cabinet 101 to maintain substantially constant contact with rack equipment 120 (FIG. 3), bracket 142 may be configured to flex and increase interior angle 154 when rack equipment 120 is inserted into the gap G2 between bracket 142 and support surface 159. In other examples, the interior angle 154 of bracket 142 may be preconfigured at some angle greater than 90 degrees but less than 180 degrees via some prior bending process for either ductile or brittle materials. Preconfiguring bracket 142 may cause bracket 142 to plastically deform such that flexing elastically is substantially limited once rack equipment 120 is inserted into the gap G2.

In the example of FIGS. 4A-4B support leg 146 is a single support leg extending substantially from a first end 178 of absorption leg 144 ("absorption first end 178") to a second end 180 of absorption leg 144 ("absorption second end 180"). Absorption leg 144 and support leg 146 may be configured such that internal corner 152 extends substantially from absorption first end 178 to absorption second end 180. Internal corner may define interior angle 154 from absorption first end 178 to absorption second end 180. Internal corner may define interior angle 154 such that interior angle 154 is substantially constant from absorption first end 178 to absorption second end 180, or may define interior angle 154 such that interior angle 154 substantially varies from absorption first end 178 to absorption second end 180.

In an example, support leg 146 may be substantially contiguous with absorption leg 144 over internal corner 152. For example, support leg 146 may include an interior side 181 and an exterior side 183 opposite interior side 181, with interior side 181 and/or exterior side 183 forming a contiguous surface with some portion of absorption leg 144. For example, interior side 181 of support leg 146 may form a contiguous (e.g., continuous and unbroken) surface with inner side 156 of absorption leg 144. Exterior side 183 of support leg 146 may form a contiguous (e.g., continuous and unbroken) surface with outer side 158 of absorption leg 144. In some examples, bracket 142 may be a substantially contiguous material configured to define both absorption leg 144 and support leg 146. Thus, in examples, absorption leg 144 and support leg 146 may be integral portions of a single piece fabricated such that the single piece defines absorption leg 144 and support leg 146. In other examples, absorption leg 144 and support leg 146 may be defined by substantially discrete pieces attached to absorption leg 144 by welding, pressing, fasteners, or some other suitable means.

In examples, damping pads 148 include a plurality of damping pads such as 148a, 148b, 148c, and 148d. Damping pads 148a, 148b, 148c, 148d are coupled to facing surface 176 of absorption leg 144, such that movement of absorption leg 144 generates corresponding movement of damping pads 148a, 148b, 148c, 148d. Damping pads 148a, 148b, 148c, 148d are configured to couple to facing surface 176 of absorption leg 144. Damping pads 148a, 148b, 148c, 148d couple to facing surface 176 such that the respective absorption surfaces of damping pads 148a, 148b, 148c, 148d substantially face away from facing surface 176. For example, FIGS. 4A, 4B illustrate absorption surface 160d of damping pad 148d and coupling surface 162d opposite absorption surface 160d. Damping pad 148d is configured on bracket 142 such that coupling surface 162d is adjacent facing surface 176 relative to absorption surface 160d (e.g., coupling surface 162d is between absorption surface 160d and facing surface 176).

Damping pads 148a, 148b, 148c, 148d may be coupled to facing surface 176 in any suitable manner. In examples, damping pad 148d is a damping mount including a stem 182 extending (e.g., protruding) from coupling surface 162d and configured to insert into a mount aperture 184 (e.g., a recess) defined by absorption leg 144. For example damping pads 148a, 148b, 148c, 148d may be configured similarly to bumpers known commercially as Tight-Grip Push-In Bumpers, available from McMaster-Carr, Princeton, N.J. Mount aperture 184 may be defined to pass from inner side 156 to outer side 158 of absorption leg 144. Stem 182 of damping pad 148d and mount aperture 184 defined by absorption leg 144 are illustrated in FIGS. 4A and 4D, with stem 182 and mount aperture shown in hidden lines in FIG. 4A. In some examples, facing surface 176 defines a stem 186 protruding from facing surface 176 and configured to insert into a mount recess 188 defined by the coupling surface of a damping pad, such as damping pad 148c. Stem 186 and mount recess 188 are shown in hidden lines in FIG. 4A. In some examples, damping pads 148a, 148b, 148c, 148d are coupled to facing surface 176 using an adhesive between the coupling surfaces of damping pads 148a, 148b, 148c, 148d and facing surface 176. For example damping pads 148a, 148b, 148c, 148d may be configured similarly to bumpers known commercially as Adhesive-Back Bumpers or Load-Rated Adhesive-Back Bumpers, available from McMaster-Carr, Princeton, N.J.

As discussed, bracket 142 includes one or more damping pads coupled to facing surface 176. Bracket 142 may include any number of damping pads. In some examples, bracket 142 includes a plurality of damping pads such as two or more of 148a, 148b, 148c, 148d. In some examples, bracket 142 includes a single damping pad coupled to facing surface 176. The single damping pad may be configured similarly to any of damping pads 148a, 148b, 148s, 148d.

As discussed, damping pads 148a, 148b, 148c, 148d are configured to absorb and/or dampen mechanical energy transmitted (e.g., by housing 121 of rack equipment 120) to an absorption surface (e.g., absorption surface 160d) of damping pads 148a, 148b, 148c, 148d. Damping pads 148a, 148b, 148c, 148d may comprise a material configured to compress when an impact force is transmitted to the absorption surface, such that damping pads 148a, 148b, 148c, 148d absorb some portion of the mechanical energy causing the impact force. Damping pads 148a, 148b, 148c, 148d may be a substantially elastic material, such that damping pads 148a, 148b, 148c, 148d deform from an initial shape when the impact force is applied, then substantially return to the initial shape when the impact force is removed. In examples, damping pads 148a, 148b, 148c, 148d include an elastomeric material such as a rubber or other polymer which exhibits an elasticity.

Support leg 146 is configured for attachment to a structure such as equipment cabinet 101 (FIG. 1). Support leg 146 may be configured for attachment to the structure using any suitable technique, such as, but not limited to, adhesives, engineering fits, fusion, friction, or welding or soldering. The attachment between support leg 146 and the structure may be substantially permanent, or, alternatively, may be configured to enable separation of support leg 146 and the structure, such that support leg 146 and the structure remain substantially usable upon separation. In examples, at least support first end 164 is configured for attachment to the structure (e.g., to post 119 of equipment cabinet 101 (FIG. 1). In examples, support first end 164 includes a first slot 166 passing through support first end 164 and configured to receive a fastener, such as a bolt or machine screw. Support leg 146 may include support second end 168 instead of or in addition to support first end 164. Support second end 168 may be configured similarly to support first end 164.

Bracket 142 may be configured such that, when bracket 142 is positioned on a structure such as equipment cabinet 101 (FIG. 1), leading edge 172 is nearer to a front section (e.g., front section 104) of the structure than internal corner 152. Bracket 142 may be configured such that leading edge 172 is substantially between internal corner 152 and the front section when bracket 142 is positioned on the structure. In examples, leading edge 172 is configured to present a rounded corner along absorption leg 144 (e.g., a corner having a curvature in the y-z plane). For example, bracket 142 may be configured such that absorption leg 144 substantially flares upward (e.g., in the positive direction of the y-axis) to define leading edge 172. The rounded corner of leading edge 172 may, for example, be configured to reduce impact forces that might arise from incidental contact between a housing 121 and bracket 142 as rack equipment 120 is inserted in gap G1 or G2 (FIG. 2, 3), and/or be configured to cause absorption leg 144 to flex upward as rack equipment 120 is inserted in gap G2.

Figure 5A:
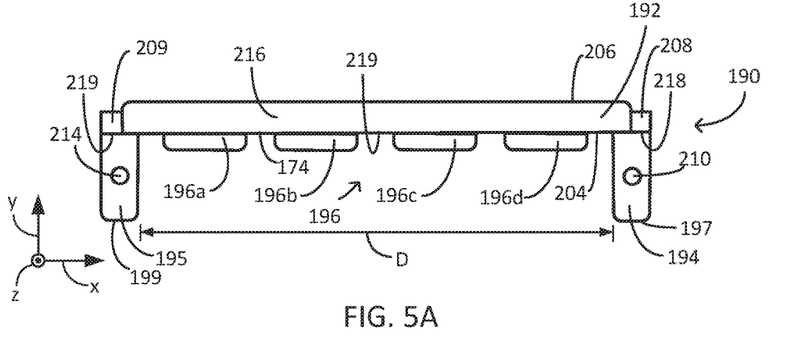
FIG. 5A is a front view of an example shock absorption bracket.
Figure 5B:
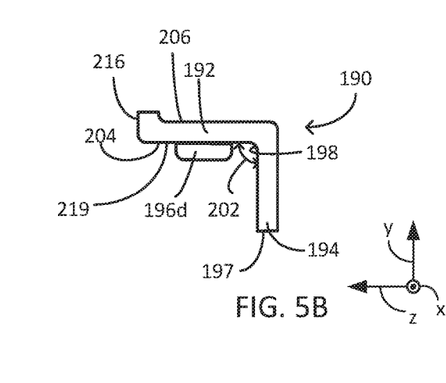
FIG. 5B is a side view of the shock absorption bracket of FIG. 5A.
Figure 5C:
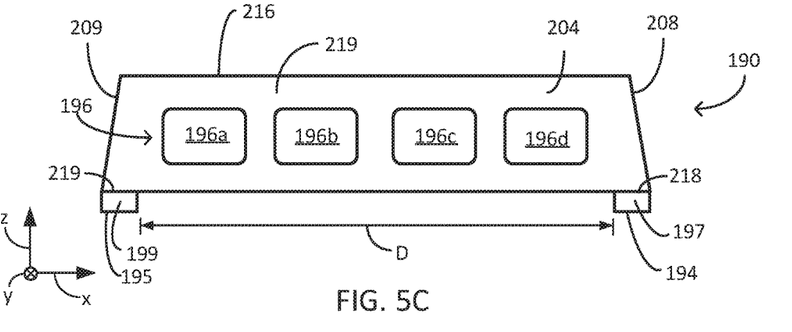
FIG. 5C is a bottom view of the shock absorption bracket of FIG. 5A and FIG. 5B.
Figure 5D:
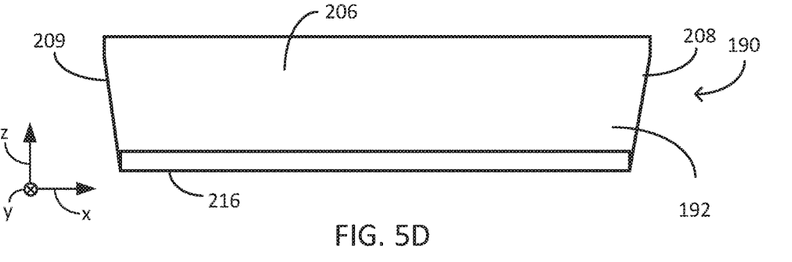
FIG. 5D is a top view of the shock absorption bracket of FIG. 5A, FIG. 5B, and FIG. 5C.

FIGS. 5A-5D illustrate an example shock absorption bracket 190 ("bracket 190"). Bracket 190 is an example of bracket 142 and bracket 134. Bracket 190 includes absorption leg 192 including absorption first end 208 and absorption second end 209, support leg 194 defining first slot 210, support leg 195 defining second slot 214, damping pads 196 including damping pad 196a, 196b, 196c, 196d, internal corner 198 defining interior angle 202, inner side 204, outer side 206, leading edge 216, and facing surface 219, which may be configured similarly to and operate relative to other bracket 190 components in the same manner as the like-named components of bracket 142 and bracket 134. FIG. 5A illustrates a front view bracket 190, FIG. 5B illustrates a side view of bracket 190, FIG. 5C illustrates a bottom view of bracket 190, and FIG. 5D illustrates a top view of bracket 190. FIGS. 5A-5D are illustrated with reference to the x-y-z axes of each figure, where the circle-dot illustrates an axis pointing out of the page and the circle-cross illustrates an axis pointing into the page.

Bracket 190 may include any number of support legs. Each support leg may be joined to absorption leg 192 to define an individual internal corner with inner side 204 of absorption leg 192. For example, as depicted at FIG. 5B, support leg 194 and inner side 204 define internal corner 198. Internal corner 198 defines interior angle 202. Support leg 195 may define an internal corner (not shown) with inner side 204 configured similarly to internal corner 198. Support leg 194 and/or support leg 195 may be substantially contiguous with inner side 204 of absorption leg 192. In some examples, bracket 190 is a substantially contiguous material configured to define two or more of absorption leg 192, support leg 194, and support leg 195. In other examples, support leg 194, and/or support leg 195 may be defined by substantially discrete pieces attached to absorption leg 192 by welding, pressing, fasteners, or some other suitable means.

Bracket 190 may be configured to define a displacement between support legs, such that each support leg is a substantially separate leg from any other support leg. For example, as depicted in the example of FIGS. 5A-5D, support leg 194 and support leg 195 define a displacement D between support leg 194 and support leg 195. The displacement D may have any dimension relative bracket 190. Further, support leg 194 and/or support leg 195 may be joined to absorption leg 192 at any location on absorption leg 192 sufficient to define an internal corner as described herein. For example, support leg 194 may be joined to absorption leg 192 substantially at support first end 208 of absorption leg 192 and support leg 195 may be joined to absorption leg 192 substantially at support second end 209. Alternately, support leg 194 and/or support leg 195 may be located at some other position on absorption leg 192.

Support leg 194 and/or support leg 195 may be configured for attachment to a structure (e.g., equipment cabinet 101 (FIG. 1). Support leg 194 and/or support leg 195 may be configured for attachment to the structure using any suitable technique, such as but not limited to, adhesives, engineering fits, fusion, friction, or welding or soldering. The attachment between support leg 194 and/or support leg 195 and the structure may be substantially permanent, or, alternatively, may be configured to enable separation of support leg 194 and/or support leg 195 and the structure, such that support leg 194 and/or support leg 195 and the structure remain substantially usable upon separation. In examples, support leg 194 includes first slot 210 passing through support leg 194 and configured to receive a fastener, such as a bolt or machine screw. Support leg 195 may include second slot 210 passing through support leg 195 and configured to receive a fastener.

In examples, bracket 190 includes one or more gussets attached to absorption leg 192 and configured to provide additional support to support leg 194 and/or support leg 195. Bracket 190 may include a first gusset attached to support leg 194 and a second gusset attached to support leg 195. The first gusset may be present within angle 202 of bracket 190 and attached to inner side 204 and at least support leg 194. For example, the first gusset may have a first edge attached to inner side 204 over a first distance and a second edge attached to support leg 194 over a second distance. In examples, the first gusset first edge and the first gusset second edge meet at internal corner 198. The first gusset first distance and the first gusset second distance may define any displacement and may have any orientation with respect to the x-y-z axes of FIGS. 5A-5D. In an example, the first gusset first edge extends substantially from support leg 194 to leading edge 216. In an example, the second edge extends substantially from inner side 204 to a terminating edge 197 of support leg 194. The second gusset may be present within angle 202 of bracket 190 and attached to inner side 204 and at least support leg 195. For example, the second gusset may have a first edge ("second gusset first edge") attached to inner side 204 over a first distance defined by the second gusset ("second gusset first distance) and a second edge ("second gusset second edge") attached to support leg 195 over a second distance defined by the second gusset ("second gusset second edge"). In examples, the second gusset first edge and the second gusset second edge meet at internal corner 198. The second gusset first distance and the second gusset second distance may define any displacement and may have any orientation with respect to the x-y-z axes of FIGS. 5A-5D. In an example, the second gusset first edge extends substantially from support leg 195 to leading edge 216. In an example, the second gusset second edge extends substantially from inner side 204 to a terminating edge 199 of support leg 195. The first gusset and/or second gusset may be attached to support leg 194, support leg 195, and/or absorption leg 192 by welding, pressing, fasteners, or some other suitable means. In examples, the first gusset and/or second gusset is substantially unitary with support leg 194, support leg 195, and/or absorption leg 192.

In some examples, bracket 190 includes an elongated support member extending between support leg 194 and support leg 195. The elongated support member may be further attached to absorption leg 192. For example, the elongated support member may include a first end attached to support leg 194, a second end opposite the first end attached to support leg 195, and an edge between the first end and the second end attached to absorption leg 192. In examples, the elongated support member is substantially separated from absorption leg 192 (e.g., the edge is displaced from absorption leg 192). The elongated support member may be attached to support leg 194, support leg 195, and/or absorption leg 192 by welding, pressing, fasteners, or some other suitable means. In examples, the elongated support member is substantially unitary with support leg 194, support leg 195, and/or absorption leg 192.

Figure 6A:
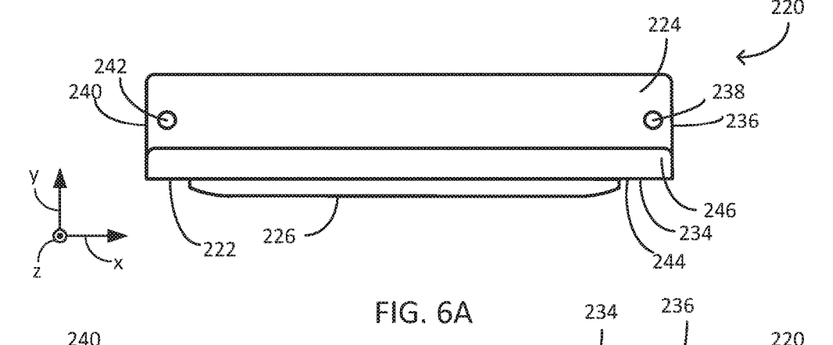
FIG. 6A is a front view of an example shock absorption bracket.
Figure 6B:
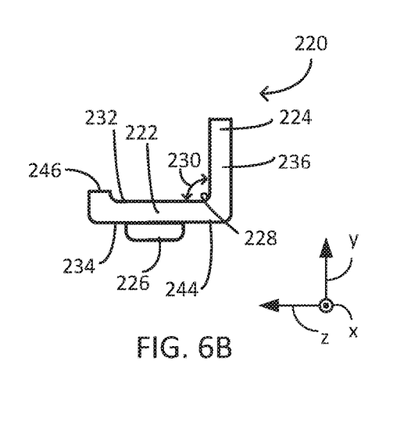
FIG. 6B is a side view of the shock absorption bracket of FIG. 6A.
Figure 6C:
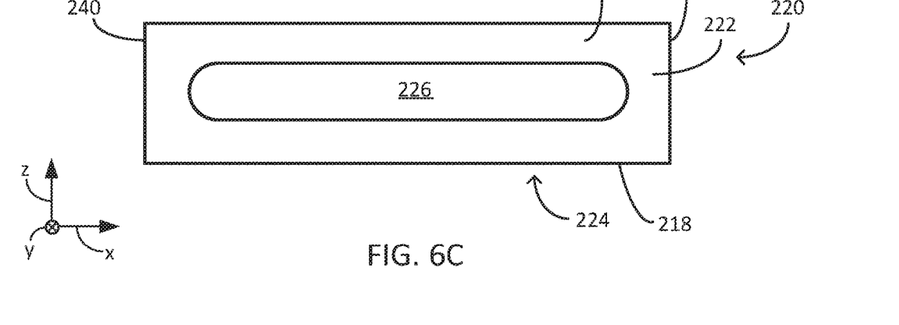
FIG. 6C is a bottom view of the shock absorption bracket of FIG. 6A and FIG. 6B.
Figure 6D:
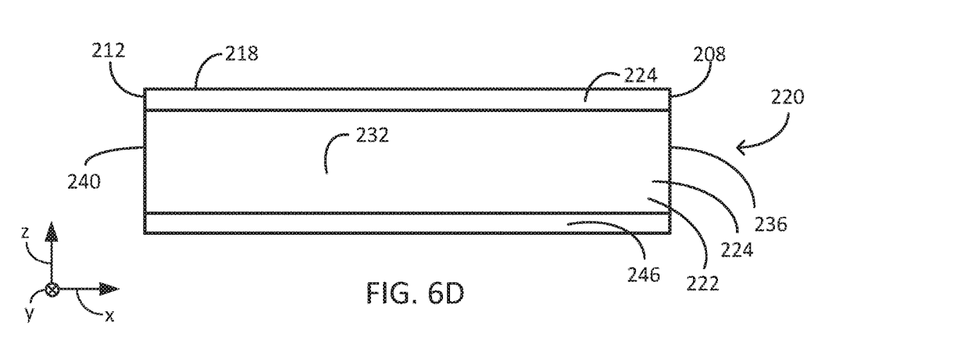
FIG. 6D is a top view of the shock absorption bracket of FIG. 6A, FIG. 6B, and FIG. 6C.

In some examples, as discussed, the shock absorption bracket may be configured such that the facing surface coupled to the one or more damping pads is defined by an outer surface of the absorption leg. Such a configuration may be beneficial depending on a desired manner of attachment to an equipment rack, a desired impact force response, or some other reason. For example, FIGS. 6A-6D illustrate an example shock absorption bracket 220 ("bracket 220"), which is an example of any of bracket 142, bracket 134, and bracket 190. Bracket 220 includes absorption leg 222, support leg 224, damping pad 226, internal corner 228 defining interior angle 230, inner side 232, outer side 234, support first end 236 defining first slot 238, support second end 240 defining second slot 242, leading edge 216, and facing surface 244, which may be configured similarly to and operate relative to other bracket 190 components in the same manner as the like-named components of bracket 142, bracket 134, and bracket 190. FIG. 6A illustrates a front view bracket 220, FIG. 6B illustrates a side view of bracket 220, FIG. 6C illustrates a bottom view of bracket 220, and FIG. 6D illustrates a top view of bracket 220. FIGS. 6A-6D are illustrated with reference to the x-y-z axes of each figure, where the circle-dot illustrates an axis pointing out of the page and the circle-cross illustrates an axis pointing into the page.

In like manner to bracket 134, bracket 142, and bracket 190, absorption leg 222 includes leading edge 246 separating inner side 232 and outer side 234 of absorption leg 222. Support leg 224 is attached to absorption leg 222 such that inner side 232 and support leg 224 define internal corner 228. Internal corner 228 defines interior angle 230. Interior angle 230 may be an angle described substantially in the y-z plane of FIGS. 6A-6D. Some portion of inner side 232 is between internal corner 228 and leading edge 246. However, in the example of FIGS. 6A-6D, outer side 234 of absorption leg 222 defines facing surface 244. Bracket 220 is configured such that facing surface 244 substantially faces one or more support surfaces (e.g. Support surface 109, 112, 114, 159) of equipment cabinet 101 (FIG. 1) when bracket 220 is attached to equipment cabinet 101. Further, in like manner to bracket 134, bracket 142, and bracket 190, damping pad 226 is coupled to facing surface 244.

Bracket 220 includes a single damping pad 226 coupled to facing surface 244. Single damping pad 226 may be an example of any of damping pads 148 (e.g., damping pad 148a, damping pad 148b, damping pad 148c, and/or damping pad 148d) and damping pads 196 (e.g., damping pad 196a, damping pad 196b, damping pad 196c, and/or damping pad 196d).

Absorption leg 136, 144, 222 and/or support leg 138 146, 194, 195, 224, as well as any individual components thereof, may be made from any suitable material. For example, the material may be any material of suitable strength and/or flexibility for the intended use of absorption leg 136, 144, 222 and/or support leg 138 146, 194, 195, 224. In some examples, the material includes a metal or a metal alloy, such as a steel alloy or aluminum alloy. In some examples, the material includes a plastic. Absorption leg 136, 144, 222 and/or support leg 138 146, 194, 195, 224, as well as any individual components thereof, may have any suitable configuration. In some examples, absorption leg 136, 144, 222 and support leg 138 146, 194, 195, 224 are formed to be physically separate from each other and subsequently attached to bracket 134, 142, 190, 220. In other examples, absorption leg 136, 144, 222 and support leg 138 146, 194, 195, 224 have a unitary body construction, e.g., are formed to be one piece. Absorption leg 136, 144, 222 and/or support leg 138 146, 194, 195, 224 may have any shape sufficient to define a bracket 134, 142, 190, 220 having the configuration and functionality as described herein.

Damping pads 148, 196, 226, as well as any individual components thereof, may be made from any suitable material. For example, the material may be any material of suitable strength, elasticity, and/or energy absorption properties for the intended use of damping pads 148, 196, 226. In some examples, the material includes an elastomeric material such as a rubber or other polymer which exhibits an elasticity. Damping pads 148, 196, 226 may have any shape sufficient to define a bracket 134, 142, 190, 220 having the configuration and functionality as described herein.

Absorption leg 136, 144, 222 and/or support leg 138 146, 194, 195, 224, and other structures described herein can be formed using any suitable technique. In some examples, absorption leg 136, 144, 222 and/or support leg 138 146, 194, 195, 224 may be forged, cast, made from bar stock, additive manufactured (e.g., three-dimensionally (3D) printed), extruded, drawn, or be produced using other suitable methods. In some examples, absorption leg 136, 144, 222 and/or support leg 138 146, 194, 195, 224 may be machined to define the configurations described herein. In other examples, absorption leg 136, 144, 222 and/or support leg 138 146, 194, 195, 224 may be formed without having to be substantially machined.

Bracket 134, 142, 190, 220 may be configured for attachment to any structure, and may be attached in any orientation relative to the structure. Bracket 134, 142, 190, 220 may be configured for attachment to any equipment cabinet 101. Equipment cabinet 101 may define any number of support surfaces 109, 112, 114 configured to support rack equipment 120. Equipment cabinet 101 may define the support surfaces using rails 111, 113, 122, 124, shelf 115, a combination of rails 111, 113, 122, 124 and shelf 115, or any other suitable components. Equipment cabinet 101 may include any number of rails 111, 113, 122, 124 and/or shelves (e.g., shelf 115). Bracket 134, 142, 190, 220 may be attached to an equipment cabinet 101 configured to store rack equipment 120 in a vertical rack arrangement. Bracket 134, 142, 190, 220 may be attached to equipment cabinet 101 in addition to isolators 128, 130 or other isolators configured to absorb and/or dampen mechanical energy transmitted to or within equipment cabinet 101. Equipment cabinet 101 may include any number of brackets 134, 142, 190, 220.

Equipment cabinet 101 may be a stand-alone equipment cabinet or may substantially surrounded and/or in contact with other equipment cabinets. Equipment cabinet may be installed and/or located in an equipment bay of a mobile platform, such as an aircraft, ship, space vehicle, or land vehicle, and may be located in a substantially stationary equipment bay, such as an equipment bay of a call center, server installation, or some other facility surrounded by a geographically stationary structure. Equipment cabinet 101 may include front section 104, rear section 106, right side section 108, and/or left side section 110. Equipment cabinet 101 may receive rack equipment through an equipment access through any of front section 104, rear section 106, right side section 108, and/or left side section 110. Bracket 134, 142, 190, 220 may be attached to any of front section 104, rear section 106, right side section 108, and/or left side section 110. Equipment cabinet 101 may include equipment access 126 in front section 104 with bracket 134, 142, 190, 220 attached to rear section 106.

Figure 7:
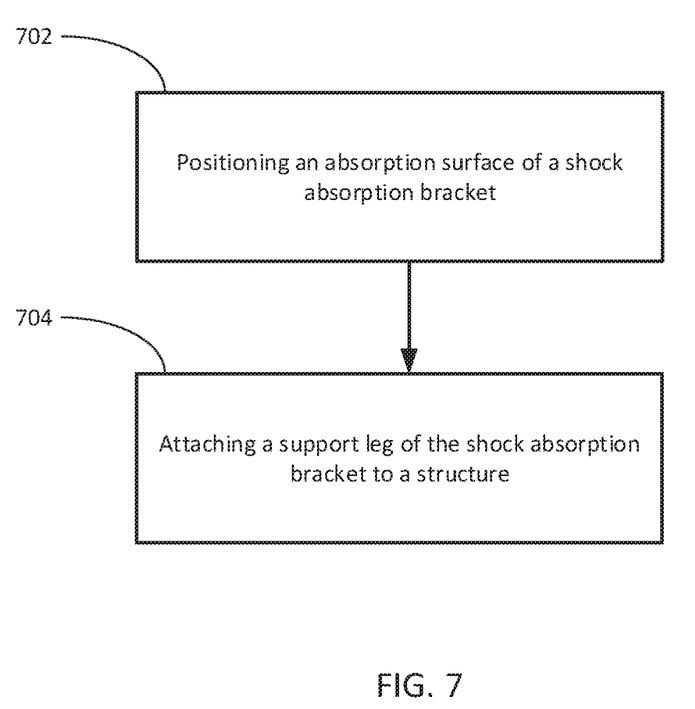
FIG. 7 is a flow diagram illustrating an example technique for attaching the shock absorption bracket to a structure.

FIG. 7 is a flow diagram illustrating an example technique for attaching a shock absorption bracket to a structure. While the technique is described with reference to specific example damping pads, absorption legs, support legs and specific structures described herein, the technique may be used with other examples components described herein.

The technique includes positioning an absorption surface 160 of a damping pad 148, 196, 226 of a shock absorption bracket 134, 142, 190, 220 toward a support surface 109, 112, 114, 159 of an equipment cabinet 101 to define a gap G1 between the absorption surface 160 and the support surface 109, 112, 114, 159 (702). The damping pad 148, 196, 226 is coupled to a facing surface 176, 219, 244 of an absorption leg 144, 192, 222 of the shock absorption bracket 134, 142, 190, 220. The technique may include positioning the facing surface 176, 219, 244 toward the toward support surface 109, 112, 114, 159 to define a gap between facing surface 176, 220, 244 and support surface 109, 112, 114, 159. The absorption leg 144, 192, 222 includes an inner side 156, 204, 232 and an outer side 158, 206, 234 opposite inner side 156, 204, 232. Inner side 156, 204, 232 or outer side 158, 206, 234 defines facing surface 176, 219, 244.

The technique may include defining gap G1 between absorption surface 160 and rail 111, 113, 122, 124 supported by equipment cabinet 101. The technique may include defining gap G1 between absorption surface 160 and shelf 115 supported by equipment cabinet 101. In examples, the technique includes positioning shock absorption bracket 134, 142, 190, 200 such that facing surface 176, 219, 244 is substantially parallel to support surface 109, 112, 114, 159. In examples, absorption leg 144, 192, 222 is an elongated member extending from absorption first end 178 and absorption second end 180. The technique may include positioning shock absorption bracket 134, 142, 190, 200 such that absorption leg 144, 192, 222 extends in a direction substantially perpendicular to rail 111, 113, 122, 124.

The technique includes attaching support leg 138, 146, 194, 195, 224 to equipment cabinet 101 (704). Support leg 138, 146, 194, 195, 224 is attached to absorption leg absorption leg 144, 192, 222 and defines an internal corner 152 defining an interior angle 154. In examples, the technique includes attaching support first end 164, 236 and/or support second end 168, 240 to equipment cabinet 101. In examples, the technique includes attaching first support leg 194 and/or second equipment leg 195 to equipment cabinet 101. The technique may include attaching support leg 138, 146, 194, 195, 224 to equipment cabinet 101 by welding, pressing, fasteners, or some other suitable means. In examples, the technique includes attaching support leg 138, 146, 194, 195, 224 to equipment cabinet 101 by inserting a fastener into first slot 166, 210, 238 and/or second slot 170, 214, 242. In examples, the technique includes attaching support leg 138, 146, 194, 195, 224 to post 118 and/or post 119 of equipment cabinet 101.

The technique may include attaching support leg 138, 146, 194, 195, 224 to equipment cabinet 101 such that a leading edge 172 is between internal corner 152 and an equipment access 126 of equipment cabinet 101. Equipment cabinet 101 may include front section 104, rear section 106, right side section 108, and left side section 110. Equipment access 126 may be in front section 104, rear section 106, right side section 108, or left side section 110 of equipment cabinet 101. In examples, the technique includes attaching support leg 138, 146, 194, 195, 224 to rear section 106. In some examples, the technique includes attaching support leg 138, 146, 194, 195, 224 to rear section 106 such that leading edge 172 is between internal corner 152 and equipment access 126 in front section 104.

The technique may include positioning rack equipment 120 within equipment cabinet 101 by passing rack equipment 120 through equipment access 126 and translating rack equipment 120 over support surface 109, 112, 114, 159. The technique may include translating rack equipment 120 in a direction from front section 104 toward rear section 106. The technique may include inserting rack equipment 120 into gap G1 between absorption surface 160 and the support surface 109, 112, 114, 159. In examples, the technique includes establishing a clearance C1 between absorption surface 160 and a housing 121 of rack equipment 120 when rack equipment 120 inserts into gap G1. In examples, the technique includes contacting absorption surface 160 and a housing 121 of rack equipment 120 when rack equipment 120 inserts into gap G1. The technique may include deforming (e.g., elastically deforming) shock absorption bracket 134, 142, 190, 220 when housing 121 contacts absorption surface 160.

Various examples have been described. These and other examples are within the scope of the following claims.

What is claimed is:

1. A shock absorption bracket configured to attach to an equipment rack defining an equipment access in a front section of the equipment rack, wherein the equipment rack includes a support surface extending from the front section to a rear section of the equipment rack, the shock absorption bracket comprising:
    an absorption leg having a leading edge, an inner side, and an outer side opposite the inner side, wherein the inner side defines a first planar surface, wherein the leading edge separates the inner side and the outer side, and wherein one of the inner side or the outer side defines a facing surface;
    a support leg attached to the absorption leg, wherein the support leg defines a second planar surface, wherein the first planar surface and the second planar surface define an internal corner, such that some portion of the inner side separates the leading edge and the internal corner, and such that the first planar surface and the second planar surface define an elongated L-bracket; and
    a damping pad coupled to the facing surface,
    wherein the second planar surface is configured to receive a fastener to attach the shock absorption bracket to a support post in the rear section of the equipment rack,
    wherein the facing surface extends horizontally over the support surface when the fastener attaches the shock absorption bracket to the equipment rack, and
    wherein the shock absorption bracket is configured to increase an internal angle defined by the internal corner when the fastener attaches the shock absorption bracket to the equipment rack and a force perpendicular to the support surface acts on the damping pad.

2. The shock absorption bracket of claim 1, wherein the inner surface defines the facing surface.

3. The shock absorption bracket of claim 1, wherein the outer surface defines the facing surface.

4. The shock absorption bracket of claim 1, wherein the damping pad comprises an elastomeric material.

5. The shock absorption bracket of claim 1, wherein the internal corner defined by the absorption leg and the support leg extends substantially from a first end of the absorption leg to a second end of the absorption leg.

6. The shock absorption bracket of claim 1, wherein the support leg is a first support leg and the internal corner is a first internal corner, and further comprising a second support leg,
    wherein the inner side of the absorption leg and the second support leg define a second internal corner,
    wherein the inner side separates the leading edge and the second internal corner, and
    wherein the first support leg and the second support leg define a displacement between the first support leg and the second support leg.

7. The shock absorption bracket of claim 1, wherein the support leg includes an interior side and an exterior side opposite the interior side, wherein the interior side is contiguous with the inner side of the absorption leg.

8. The shock absorption bracket of claim 1, wherein the damping pad is an individual damping pad in a plurality of damping pads coupled to the facing surface.

9. The shock absorption bracket of claim 1, wherein one of the absorption leg or the damping pad defines a protrusion and the other of the absorption leg or the damping pad defines a recess configured to receive the protrusion.

10. The shock absorption bracket of claim 1, wherein the leading edge is configured to define a curvature between the leading edge and the facing surface in a plane substantially perpendicular to the facing surface.

11. A system comprising:
   an equipment rack defining an equipment access in a front section of the equipment rack, wherein the equipment rack includes a support surface extending from the front section to a rear section of the equipment rack, wherein the equipment rack is configured to receive rack equipment through the equipment access to support the rack equipment with the support surface, and wherein the equipment rack is configured to couple a front panel of the rack equipment to the front section when the support surface supports the rack equipment; and
   a shock absorption bracket configured to attach to the equipment rack comprising:
      an absorption leg having a leading edge, an inner side, and an outer side opposite the inner side, wherein the inner side defines a first planar surface, wherein the leading edge separates the inner side and the outer side, and wherein one of the inner side or the outer side defines a facing surface;
      a support leg attached to the absorption leg and attached to the structure, wherein the support leg defines a second planar surface, wherein the first planar surface and the second planar surface define an internal corner, such that some portion of the inner side separates the leading edge and the internal corner, and such that the first planar surface and the second planar surface define an elongated L-bracket; and
      a damping pad having an absorption surface and a coupling surface opposite the absorption surface, wherein the coupling surface is coupled to the facing surface, and wherein the absorption surface substantially faces the support surface,
   wherein the second planar surface is configured to receive a fastener to attach the shock absorption bracket to a support post in the rear section of the equipment rack,
   wherein the facing surface extends horizontally over the support surface when the fastener attaches the shock absorption bracket to the equipment rack, and
   wherein the shock absorption bracket is configured to increase an internal angle defined by the internal corner when the fastener attaches the shock absorption bracket to the equipment rack and a force perpendicular to the support surface acts on the damping pad.

12. The system of claim 11, wherein the damping pad and the absorption leg are displaced from the support surface, such that the damping pad and the support surface define a gap between the damping pad and the support surface.

13. The system of claim 11, wherein the facing surface is substantially parallel to the support surface.

14. The system of claim 11, wherein support post is a first support post and further comprising a second support post in the rear section of the equipment rack, wherein the first support post is substantially perpendicular to the support surface and the second support post is substantially parallel to the first support post, and wherein the shock absorption bracket extends between the first support post and the second support post.

15. The system of claim 11, wherein the damping pad comprises an elastomeric material.

16. A method comprising:
   positioning an absorption surface of a damping pad of a shock absorption bracket toward a support surface defined by an equipment rack to define a gap between the absorption surface and the support surface, wherein a coupling surface of the damping pad is coupled to a facing surface of an absorption leg of the shock absorption bracket,
   wherein the equipment rack defines an equipment access in a front section of the equipment rack and the support surface extends from the front section to a rear section of the equipment rack,
   wherein the absorption leg has a leading edge, an inner side, and an outer side opposite the inner side, wherein the inner side defines a first planar surface and the leading edge separates the inner side and the outer side, and
   wherein one of the inner side or the outer side defines the facing surface; and
   attaching a support leg of the shock absorption bracket to a support post in the rear section of the equipment rack,
   wherein the support leg defines a second planar surface defining an internal corner with the first planar surface, such that some portion of the inner side separates the leading edge and the internal corner, and such that the first planar surface and the second planar surface define an elongated L-bracket,
   wherein the second planar surface is configured to receive a fastener to attach the shock absorption bracket to the support post,
   wherein the facing surface extends horizontally over the support surface when the fastener attaches the shock absorption bracket to the equipment rack, and
   wherein the shock absorption bracket is configured to increase an internal angle defined by the internal corner when the fastener attaches the shock absorption bracket to the equipment rack and a force perpendicular to the support surface acts on the damping pad.

17. The method of claim 16 further comprising
   attaching the support leg to a rear section of the structure; and
   positioning the shock absorption bracket to place a leading edge of the absorption bracket between a front section of the structure and the internal corner.

18. The shock absorption bracket of claim 1, wherein the shock absorption bracket is configured to increase the internal angle when a rack equipment supported by the support surface contacts the damping pad and imparts the force perpendicular to the support surface.

19. The shock absorption bracket of claim 18 further comprising the equipment rack, wherein:
   the equipment rack is configured to receive the rack equipment through the equipment access, and
   the equipment rack is configured to couple a front panel of the rack equipment to the front section.

20. The shock absorption bracket of claim 1, wherein the damping pad is configured to face the support surface when the fastener attaches the shock absorption bracket to the equipment rack.

* * * * *